United States Patent [19]
Edmond et al.

[11] Patent Number: 6,120,600
[45] Date of Patent: Sep. 19, 2000

[54] DOUBLE HETEROJUNCTION LIGHT EMITTING DIODE WITH GALLIUM NITRIDE ACTIVE LAYER

[75] Inventors: John A. Edmond, Cary; Hua-Shuang Kong, Raleigh, both of N.C.

[73] Assignee: Cree, Inc., Durham, N.C.

[21] Appl. No.: 09/059,649

[22] Filed: Apr. 13, 1998

Related U.S. Application Data

[62] Division of application No. 08/436,141, May 8, 1995, Pat. No. 5,739,554.

[51] Int. Cl.[7] .................................................. C30B 25/14
[52] U.S. Cl. .............................. 117/89; 117/104; 117/952
[58] Field of Search ............................... 117/89, 104, 952

[56] References Cited

U.S. PATENT DOCUMENTS

| | | |
|---|---|---|
| 3,740,622 | 6/1973 | Pankove et al. . |
| 3,819,974 | 6/1974 | Stevenson et al. . |
| 3,849,707 | 11/1974 | Braslau et al. . |
| 3,864,592 | 2/1975 | Pankove . |
| 3,984,263 | 10/1976 | Asao et al. . |
| 4,153,905 | 5/1979 | Charmakadze et al. . |
| 4,396,929 | 8/1983 | Ohki et al. . |
| 4,408,217 | 10/1983 | Kobayashi et al. . |
| 4,473,938 | 10/1984 | Kobayashi et al. . |
| 4,476,620 | 10/1984 | Ohki et al. . |
| 4,855,249 | 8/1989 | Akasaki et al. . |
| 4,862,471 | 8/1989 | Pankove . |
| 4,903,088 | 2/1990 | Van Opdorp . |
| 4,911,102 | 3/1990 | Manabe et al. . |
| 4,985,742 | 1/1991 | Pankove . |
| 5,122,485 | 6/1992 | Manabe et al. . |
| 5,218,216 | 6/1993 | Manabe et al. . |
| 5,239,188 | 8/1993 | Takeuchi et al. . |
| 5,247,533 | 9/1993 | Okazaki et al. . |
| 5,272,108 | 12/1993 | Kozawa . |
| 5,273,933 | 12/1993 | Hatano et al. . |
| 5,278,433 | 1/1994 | Manabe et al. . |
| 5,281,830 | 1/1994 | Kotaki et al. . |
| 5,290,393 | 3/1994 | Nakamura . |
| 5,306,662 | 4/1994 | Nakamura et al. . |
| 5,369,289 | 11/1994 | Tamaki et al. . |
| 5,387,804 | 2/1995 | Suzuki et al. . |
| 5,389,571 | 2/1995 | Takeuchi et al. . |
| 5,393,993 | 2/1995 | Edmond et al. . |
| 5,578,839 | 11/1996 | Nakamura et al. . |
| 5,838,707 | 11/1998 | Ramdani et al. .......................... 372/45 |
| 5,843,227 | 12/1998 | Kimura et al. ........................... 117/101 |
| 5,880,486 | 3/1999 | Nakamura et al. ....................... 257/96 |
| 5,886,367 | 3/1999 | Udagawa .................................. 257/64 |
| 5,895,225 | 4/1999 | Kidoguchi et al. ....................... 438/47 |

FOREIGN PATENT DOCUMENTS

| | | |
|---|---|---|
| 0460710 | of 0000 | European Pat. Off. . |
| 0541373 | 5/1993 | European Pat. Off. . |
| 0579897 | 1/1994 | European Pat. Off. . |
| 0599224 | 6/1994 | European Pat. Off. . |
| 0622858 | 11/1994 | European Pat. Off. . |
| 0675552 | 10/1995 | European Pat. Off. . |
| 7007182 | 10/1995 | Japan . |
| WO96/09653 | 3/1996 | WIPO . |

OTHER PUBLICATIONS

"Prepration of Mg–doped GaN Diodes Exhibiting Violet Electroluminescence," H.P. Maruska, Mat. Res. Bull., vol. 7, No. 8, pp. 777–781.

(List continued on next page.)

*Primary Examiner*—Robert Kunemund
*Attorney, Agent, or Firm*—Philip Summa, P.A.

[57] ABSTRACT

A double heterostructure for a light emitting diode comprises a layer of aluminum gallium nitride having a first conductivity type; a layer of aluminum gallium nitride having the opposite conductivity type; and an active layer of gallium nitride between the aluminum gallium nitride layers, in which the gallium nitride layer is co-doped with both a Group II acceptor and a Group IV donor, with one of the dopants being present in an amount sufficient to give the gallium nitride layer a net conductivity type, so that the active layer forms a p-n junction with the adjacent layer of aluminum gallium nitride having the opposite conductivity type.

7 Claims, 8 Drawing Sheets

OTHER PUBLICATIONS

Violet Luminescence of Mg–doped GaN. H. P. Maruska et al., Appl. Phys. Lett., vol. 22, No. 6, Mar. 1973, pp. 303–305.

International Search Report for PCT/US96/5160 filed Apr. 15, 1996, dated Aug. 30, 1996 by A. De Laere.

"Optical Gain of Optically Pumped $Al_{0.9}N/GaN$ Double Heterostructure at Room Temperature," S.T. Kim et al., Appl. Phys. Lett., vol. 64, No. 12, Mar. 1994, pp. 1535–1536.

"Electrical and Structural Properties of $In_xGa_{1-x}N$ on GaAs," C.R. Abernathy, Appl. Phys. Lett. No. 66, No. 13, Mar. 1995, pp. 1632–1634.

"p–Type Conduction in Mg–doped $Ga_{0.91}In_{0.99}N$ Grown by Metalorganic Vapor–Phase Epitaxy," S. Yamasaki et al., APL, vol. 66,No. 9, 1995, pp.

"GaN Electroluminescent Diodes," J.I. Pankove et al., RCA Review, vol. 32, Sep. 1971, pp. 382–393.

"Gallium Nitride Films," T. L. Chu, J. Electrochem, vol. 118, No. 7 (1971), pp. 1200–1203.

"GaN Blue Light–Emitting Diodes," J. I. Pankove, Journal of Luminescence, vol. 5 (1972), pp. 84–86.

"Room Temperature Low–Threshold Surface–Stimulated Emission by Optical Pumping from $Al_{0.1}Ga_{0.9}N/GaN$ Double Heterostructure," H. Amano et al., Jpn. J.Appl. Phys. vol. 32 (1993), pp. L–1000–L–1002.

"Conductivity Control of AlGaN Fabrication of AlGaN/GaN Multi–Heterostructure and Their Application to UV/Blue Light Emitting Devices," I. Akasaki et al., Mat. Res. Soc. Symp. Proc., vol. 242, Materials Research Society, 1992, pp. 383–395.

"High Power InGaN/GaN Double–Heterostructure Violet Light Emitting Diodes," S. Nakamura, appl. Phys. Lett., vol. 62, No. 19, May 1993, pp. 2390–2392.

"P–GaN/N–InGaN/N–GaN Double–Heterostructure Blue–Light–Emitting Diodes," S. Nakamura, Jpn., J. Appl. Phys. vol. 32 (1993), pp. L8–L11.

"Candela–Class High–Brightness InGaN/AlGaN Double–Heterostructure Blue–Light–Emitting Diodes," S. Nakamura, Appl. Phys. Lett. vol. 64, No. 13, Mar. 1994, pp. 1687–1689.

Perspective of the UV/Blue Light Emitting Devices Based on GaN and Related Compounds, I. Akasaki et al., Opto-electronics Devices and Technologies, vol. 7, No. 1, Jun. 1992, pp 49–56.

"High–Brightness InGaN/AlGaN Double–Heterostructure Blue–Green–Light–Emitting Diodes," S. Nakamura et al., J. Appl. Phys., vol. 76, No. 12, Dec. 1994, pp. 8189–8191.

"Development of Blue High–Intenity LED," 956C3806 Tokyo Nikkei Science in Japanese, Oct. 1994, pp. 44–55.

"Widegap Column–III Nitride Semiconductors for UV/Blue Light Emitting Devices," I. Akasaki et al., J. Electrochem. Soc., vol. 141, No. 8, Aug. 1994, pp. 2266–2271.

"Room Temperature Ultraviolet/Blue Light Emitting Devices Based on AlGaN/GaN Multi–Layered Structure," I. Akasaki et al., Extended Abstracts of the 1992 International Conf. on Solid State Devices and Materials, Tsukuba, 1992, pp. 327–329.

"Conductivity Control of GaN and Fabrication of UV/Blue GaN Light Emitting Devices," I. Akasaki et al., Physica B, vol. 185, 1993, pp. 428–432.

"UV and Blue Electroluminescence from Al/GaN:Mg/GaN LED Treated with Low–Energy Electron Beam Irradiation (LEENI)," H. Amano, Inst. Phys. Conf. Ser. No. 106, Chapter 10, pp. 725–730.

"High efficiency UV and Blue Emitting Devices Prepared by MOVPE and Low Energy Electron Beam Irradiation Treatment," I. Akasaki et al., SPIE, vol. 1361, Physical Concepts of Materials for Novel Optoelectronic Device Applications (1990), pp. 138–149.

"Electrical Properties of n–type Vapor Grown Gallium Nitride," M. Ilegems et al.; J. Phys. Chem. Solids, vol. 34, 1973, pp. 885–895.

"GaN Yellow–Light Emitting Diodes," J. I. Pankove, Journal of Luminescence, vol. 6 (1973), pp. 54–60.

"Violet–Electroluminescence from Mg–doped GaN Point Contact Diodes," Y. Morimoto, Japan J. Appl. Phys., vol. 13 (1974), No. 8, pp. 1307–1308.

"Anomalous I–V Characteristics in Mg–doped GaN Point Contact Diodes," Y. Morimoto, Japan J. Appl. Phys., vol. 14 (1975), No. 4, pp. 577–578.

"Gallium Nitride Diodes Emitting Dark Blue to Violet Light," A. N. Vasilishchev et al., Sov. Phys. Semicond., vol. 9, No. 9 (1975), pp. 1189–1190.

"Low–Voltage GaN LED's," V. M. Andreev, Sov. Tech. Phys. Lett., vol. 3, No. 2, Feb. 1977, pp. 75–76.

"Efficient Injection Mechanism for Electroluminescence in GaN," G. Jacob et al., Applied Physics Letters, vol. 30, No. 18, Apr. 1977, pp. 412–414.

"Improvements on the Electrical and Luminescent Properties of Reactive Molecular Beam Epitaxially Grown GaN Films by Using AIN–Coated Sapphire Substrates," S. Yoshida et al., Appl. Phy. Lett. 42(5), Mar. 1983, pp. 427–429.

"Properties of GaN Tunneling MIS–Light–Emitting diodes," O. Lagerstedt et al., J. Appl. Phys. 39(5), May 1978, pp. 2953–2957.

"P–Type Conduction in Mg–Doped GaN Treated with Low–Energy Electron Beam Irradiation (LEEBI)," H. Amano et al., JJAP, vol. 28, No. 12, Dec. 1989, pp. 12112–12114.

"Molecular Beam Epitaxy of Nitride Thin Films," M. J. Paisley, Journal of Crystal Growth 127 (1993), pp. 136–142.

Growth of $In_xGa_{(1-x)}N$ Compound Semiconductors and High–Power InGaN/AlGaN Double Heterostructure Violet–Light–Emitting Diodes, S. Nakamura, Microelectronics Journal, vol. 25, 1994, pp. 651–659.

"Preparation of $Al_xGa_{1-x}N/GaN$ Heterostructure by Movpe, K. et al., Journal of Crystal Growth," vol. 104, 1990, pp. 533–538.

"Metalorganic Vapor Phase Epitaxial Growth and Properties of $GaN/Al_{0.1}Ga_{0.9}N$ Layered Structures," K. Itoh et al., Japanese Journal of Applied Physics, vol. 30,No. 9A, Sep. 1991, pp. 1924–1927

DOUBLE HETEROJUNCTION LIGHT EMITTING DIODE WITH GALLIUM NITRIDE ACTIVE LAYER

This application is a divisional of Ser. No. 08/436,141 filed May 8, 1995, now U.S. Pat. No. 5,739,554.

FIELD OF THE INVENTION

The present invention relates to light emitting diodes, and in particular, relates to light emitting diodes formed in semiconductor materials with sufficiently wide band gaps to emit light in the blue portion of the visible spectrum.

BACKGROUND OF THE INVENTION

A light emitting diode ("LED") is a photonic semiconductor device. Photonic semiconductor devices fall into three categories: devices that convert electrical energy into optical radiation (LED's and diode lasers), devices that detect optical signals (photodetectors), and devices that convert optical radiation into electrical energy (photovoltaic devices or solar cells).

Although all three of these categories or devices have useful applications, the LED may be the most commonly recognized because of its application to such a wide variety of products and applications such as scientific equipment, medical equipment, and perhaps most commonly, various consumer products in which LEDs form the light source for various signals, indicators, gauges, clocks, and many other familiar items.

Semiconductor sources such as LEDs are particularly desirable as light output devices in such items because of their generally long lifetime, their low power requirements, and their high reliability.

In spite of their widespread use, LEDs are to some extent functionally limited, because the color that an LED can produce is fundamentally limited by the nature of semiconductor materials in which the LED is formed. As well known to those of ordinary skill in this and related arts, the light produced by an LED is referred to as "electroluminescence" and represents the generation of light by an electric current passing through a material under an applied electric field. Any given material that produces electroluminescent light tends to do so over a relatively narrow range of wavelengths under given circumstances. Electroluminescence thus differs from thermal radiation or incandescence which generally have much broader spectral widths.

More fundamentally, an LED's luminescence is produced by basic quantum mechanical transitions between energy levels within the semiconductor material. Because the bands within a material depend both upon the material and its doping, the energy of the transition, and thus the color of the radiation it produces, is limited by the well known relationship (E=hv) between the energy (E) of a transition and the frequency (v) of the light it produces (h is Plank's constant). Blue light has a shorter wavelength (and thus a higher frequency) than the other colors in the visible spectrum, and thus must be produced from transitions that are greater in energy than those transitions which produce green, yellow, orange or red light.

More specifically, the entire visible spectrum runs from the violet at about 390 nanometers to the red at about 770 nanometers. In turn, the blue portion of the visible spectrum can be considered (somewhat arbitrarily) to extend between the wavelengths of about 425 and 480 nanometers. The wavelengths of 425 and 480 nanometers in turn represent energy transitions (also somewhat arbitrarily) of about 2.6 eV and about 2.9 eV. Accordingly, only materials with a bandgap of at least about 2.6 eV can produce blue light, even under the best of conditions.

As is further well recognized, blue is one of the primary colors, and thus any devices which hope to produce full color displays using LEDs need to incorporate blue in some fashion. Absent efficient blue LEDs, some other method such as filtering or shuttering must be used to produce a blue contribution to a display that otherwise lacks a blue LED source.

From another standpoint, blue light's shorter wavelength allows it to be used to store more information on optical memory devices (such as CD ROM) than can red or yellow light. In particular, a CD ROM of a given physical size can hold about eight times as much information using blue light than it could when using red light. Thus, the advantages for computer and other sorts of optical memories using blue light are quite attractive.

Candidate materials with sufficient bandgaps to produce blue light include silicon carbide, gallium nitride, other Group III nitrides, zinc sulfide, and zinc selenide. More common semiconductor materials such as silicon, gallium phosphide, or gallium arsenide are unsuitable for producing blue light because their bandgaps are on the order of 2.26 eV or less.

The last decade has seen a great deal of progress in both the basic and commercial development of blue light emitting diodes, including a number of contributions by the assignee of the present invention. These include U.S. Pat. Nos. 4,918,497; 4,966,862; 5,027,168; and 5,338,944.

Another candidate material for blue light emitting diodes is gallium nitride (GaN) and its analogous Group III (i.e. Group III of the periodic table) nitride compounds such as aluminum gallium nitride (AlGaN), indium gallium nitride (InGaN), indium aluminum nitride (InAlN) and in some circumstances indium aluminum gallium nitride (InAlGaN). These materials are particularly attractive because they offer direct energy transitions with bandgaps from between about 3.4 to about 6.2 eV at room temperature. As known to those familiar with LEDs and electronic transitions, a direct (or "vertical") transition occurs in a semiconductor when the valance band maxima and the conduction band minima have the same K value, which in turn means that crystal momentum is conserved during the transition so that the energy produced by the transition can go predominantly into the photon; i.e. to produce light rather than heat. When the conduction and valance band minima are not of the same K value, a phonon (i.e. an emission of vibrational energy) is required to conserve crystal momentum and the transition is called "indirect." The phonon's energy essentially reduces the energy of any resulting photon, thus reducing both the frequency and the intensity of the emitted light. A full discussion of the theory and operation of LEDs is given in Chapter 12 of Sze, *Physics of Semiconductor Devices*, Second Edition (1981), pp. 681ff.

From a more lay point of view, the direct transition characteristics of group III nitrides, including gallium nitride, offer the potential for brighter and more efficient emissions—and thus brighter and more efficient LEDS—than do the emissions from indirect materials such as silicon carbide, all other factors being generally equal.

Accordingly, much interest in the last decade has also focused on producing light emitting diodes in gallium nitride and the related group III nitrides.

Although gallium nitride offers a direct transition over a wide bandgap, and thus a theoretically greater brightness, the material presents a particular set of technical problems in manufacturing working devices. The primary problem is the lack of bulk single crystals of gallium nitride which in turn means that gallium nitride or other group III nitride devices must be formed as epitaxial layers on other materials. The most commonly used material to date has been sapphire (aluminum oxide, $Al_2O_3$). Sapphire offers a reasonable crystal lattice match to Group III nitrides, thermal stability, and transparency, all of which are generally useful in producing a light emitting diode. Sapphire offers the disadvantage, however, of being unsuitable for conductivity doping. In turn, this means that the electric current that must be passed through an LED to generate the emission cannot be directed through the sapphire substrate. Thus other types of connections to the LED must be made. In general, LEDs with "vertical" geometry (i.e. using conductive substrates so that ohmic contacts can be placed at opposite ends of the device) are preferred for a number of reasons, including their easier manufacture than such "nonvertical" devices.

Accordingly, the assignee of the present invention has developed the use of silicon carbide substrates for gallium nitride and other Group III devices as a means of solving the conductivity problems of sapphire as a substrate. Because silicon carbide can be doped conductively, "vertical" LEDs can be formed on it; i.e. devices in which one contact can be made to the top of a device and the second contact to the bottom of the device, a structure which greatly facilitates the manufacture of the LED as well as the incorporation of the LED into circuits or combination devices or structures.

In spite of these theoretical advantages, a consistently reliable and predictable blue emission using a gallium nitride active layer has yet to be accomplished. For example, some workers have used silicon and zinc to co-dope or compensate indium gallium nitride (InGaN) but have interpreted their results to mean that gallium nitride standing alone is not suited as well as InGaN for an LED because InGaN gives a better band-to-band ("interband") transition for a light emitting diode.

Similarly, others have prepared heterojunctions from AlGaN and GaN, but never attempted or described compensated doping, and by all indications, used an intrinsic n-type gallium nitride and p-type AlGaN for the junction. Indeed, if some of the prior art structures are properly understood, doping them with a compensating acceptor such as zinc would have produced an insulating layer rather than a compensated one.

OBJECT AND SUMMARY OF THE INVENTION

Accordingly, it is an object of the present invention to provide a light emitting diode that takes advantage of gallium nitride's properties, that does so to produce an emission that is both consistent and predictable, and that does so using a compensated active layer.

The invention meets this object with a double heterostructure for a light emitting diode, said heterostructure comprising a layer of aluminum gallium nitride having a first conductivity type; a layer of aluminum gallium nitride having the opposite conductivity type; and a conductive layer of gallium nitride between said aluminum gallium nitride layers, said gallium nitride layer being co-doped with both a Group II acceptor and a Group IV donor, with one of said dopants being present in an amount sufficient to give said gallium nitride layer a net conductivity type, and forming a p-n junction with the adjacent layer of aluminum gallium nitride having the opposite conductivity type therefrom.

In another aspect the invention comprises a double heterostructure light emitting diode that emits in the blue portion of the visible spectrum and comprising a substrate; a buffer layer on said substrate; and the double heterostructure of the invention on the buffer layer.

In yet a third aspect, the invention comprises a method of producing an active layer of compensated n-type gallium nitride for a double heterostructure light emitting diode that emits in the blue portion of the visible spectrum The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION

In its broadest aspect, the invention is a double heterostructure for a light emitting diode comprises a layer of aluminum gallium nitride having a first conductivity type; a layer of aluminum gallium nitride having the opposite conductivity type; and an active layer of gallium nitride between the aluminum gallium nitride layers, in which the gallium nitride layer is co-doped with both a Group II acceptor and a Group IV donor, with one of the dopants being present in an amount sufficient to give the gallium nitride layer a net conductivity type, so that the active layer forms a p-n junction with the adjacent layer of aluminum gallium nitride having the opposite conductivity type.

In a preferred embodiment, the invention is a double heterostructure for a light emitting diode in which the heterostructure comprises a p-type layer of aluminum gallium nitride, an n-type layer of aluminum gallium nitride, and an n-type layer of gallium nitride between the aluminum gallium nitride layers. The gallium nitride layer is codoped with both zinc and silicon and forms a p-n junction with the p-type layer of aluminum gallium nitride.

The double heterostructure offers several advantages over homostructure or single heterostructure devices. These can include enhanced emission based on the different refractive indexes between GaN and AlGaN; more efficient carrier confinement, which in turn leads to more efficient carrier recombination and thus a brighter output in an LED.

Figure 1:
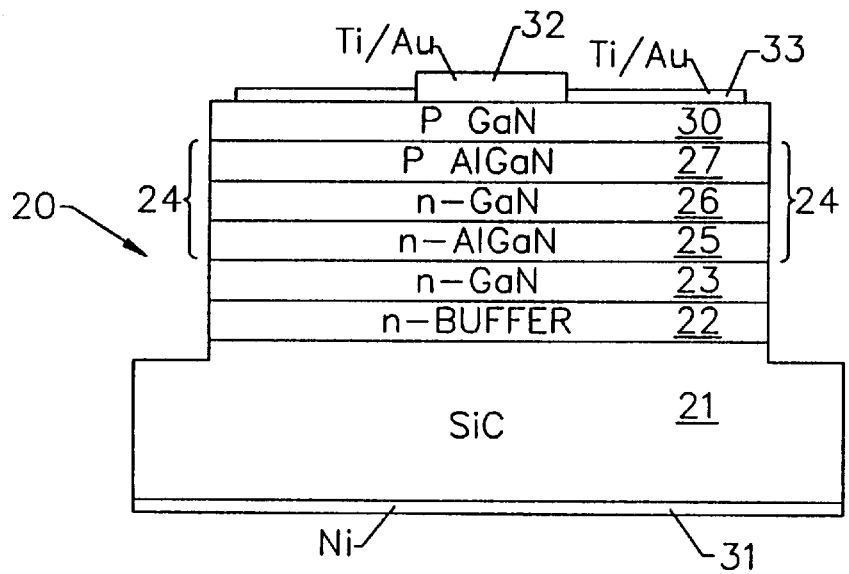
FIG. 1 is a cross-sectional view of a first embodiment of a light-emitting diode (LED) according to the present invention.

In a preferred embodiment, the double heterostructure will be incorporated in light emitting diode such as the one broadly designated at 20 in FIG. 1. The double heterostructure light emitting diode 20 illustrated in FIG. 1 emits in the blue portion of the visible spectrum and comprises a substrate 21 preferably formed of silicon carbide that has been sufficiently doped to provide a conductive substrate for the vertical structure LED 20 illustrated in FIG. 1. In order to match the crystal structure of the buffer and aluminum gallium nitride layers on the substrate 21, the silicon carbide substrate has a polytype preferably selected from the group consisting of 6 H or 4 H silicon carbide.

As known by those familiar with these materials, 4 H and 6 H are two of the hexagonal crystal forms of silicon carbide, and on which gallium nitride (and other Group III nitrides) form hexagonal polytypes. If cubic (e.g. 3 C) silicon carbide is used as the substrate, however, gallium nitride can also form a cubic structure.

The LED 20 next includes a buffer layer 22 on the substrate 21. Appropriate buffer layers are described in U.S. Pat. No. 5,393,993, and two pending applications, all of which are assigned to the assignee of the present invention and incorporated entirely herein by reference. The pending applications are Ser. Nos. 08/309,247 and 08/309,251; both filed Sep. 20, 1995 and both to named inventors Edmond et al. The buffer structure provides an appropriate crystal and electronic transition between the silicon carbide substrate and the double heterostructure portion of the LED 20.

In one embodiment the buffer layer comprises a first layer of gallium nitride and aluminum nitride; and a second layer of gallium nitride and aluminum nitride adjacent to the first layer. The mole percentage of aluminum nitride in the second layer is substantially different from the mole percentage of aluminum nitride in the first layer.

In another embodiment the buffer layer comprises a conductive layer selected from the group consisting of gallium nitride, aluminum nitride, indium nitride, ternary Group III nitrides having the formula $A_xB_{1-x}N$, where A and B are Group III elements and where x is zero, one, or a fraction between zero and one, quaternary Group III nitrides having the formula $A_xB_yC_{1-x-y}N$ where A, B, and C are Group III elements; x and y, are zero, one, or a fraction between zero and one, and 1 is greater than (x+y), and alloys of silicon carbide with such ternary and quaternary Group III nitrides.

In yet another embodiment, the buffer layer comprises a first layer upon the substrate formed of a graded composition of silicon carbide aluminum gallium nitride in which the portion adjacent the substrate is substantially entirely silicon carbide and the portion furthest from the substrate is substantially entirely aluminum gallium nitride with the portions therebetween being progressively graded in content from predominantly silicon carbide to predominantly aluminum gallium nitride. A second layer can be added to the first layer, and can be formed of a graded composition of aluminum gallium nitride.

In preferred embodiments, the LED 20 further comprises an n-type gallium nitride epitaxial layer 23 on the buffer layer 22 which provides an additional crystal transition between the substrate, the buffer, and the heterostructure.

The LED 20 next includes a double heterostructure indicated by the brackets 24 in FIG. 1. The double heterostructure 24 includes an n-type layer of aluminum gallium nitride 25 which, when the n-type gallium nitride epitaxial layer 23 is included in the structure, rests upon the n-type gallium nitride epitaxial layer 23. The n-type layer 25 of aluminum gallium nitride has the formula $Al_xGa_{1-x}N$, where x designates the mole fraction of aluminum, and where 1 is greater than x and x is greater than 0 (1>x>0). In preferred embodiments the mole fraction x is between about 0.05 and 2.0, and in the most preferred embodiments, the mole fraction x is about 0.1. The aluminum gallium nitride layer 25 furthermore has a net doping density of about 2E18 and is doped with silicon in the most preferred embodiments. As commonly used in this art, "E", is an abbreviated exponential notation for dopant density, so that 2E18 represents $2 \times 10^{18}$ $cm^{-3}$.

The double heterostructure 24 includes an active layer 26 of gallium nitride on the n-type aluminum gallium nitride layer 25 which, as noted above, is compensated with a Group II acceptor and a Group IV donor, and in which the preferred Group II acceptors are zinc or cadmium or magnesium, and in which carbon can comprise a Group IV acceptor. The preferred Group IV donor is silicon or germanium. In the most preferred embodiments, the Group II acceptor is zinc, and the Group IV donor is silicon as these produce the characteristic blue emission described herein with respect to a number of the other drawings. The net doping density of the active layer 26 is between about 1E18 and 4E18, and most preferably about 2E18.

The double heterostructure is completed with a p-type aluminum gallium nitride layer 27 which has the formula $Al_xGa_{1-x}N$ where one is greater than x and x is greater than 0 (1>x>0), and in which the preferred mole fraction x is also between about 0.05 and 2.0, and most preferably about 0.1.

In preferred embodiments, the LED 20 can further comprise a p-type gallium nitride layer 30 on the top p-type layer 27 of the heterostructure. The p-type layer 27 has a net doping density of about 1E19 and is preferably doped with aluminum.

The LED 20 illustrated in FIG. 1 further comprises respective ohmic contacts 31 to the substrate and 32 to the top layer; i.e. to the p-type gallium nitride layer 30 in the embodiment illustrated in FIG. 1. It will be understood, however, that in embodiments that do not include the p-type gallium nitride layer 30, the ohmic layer 32 is made directly to the p-type aluminum gallium nitride layer 27 of the double heterostructure.

FIG. 1 also illustrates that in preferred embodiments, the contact 32 comprises a bonding pad of titanium and gold. In a most preferred embodiment, the contact is formed from a thin layer of titanium (Ti) overlaid with a layer of gold (Au). In a preferred embodiment, the basic contact 32 is accompanied by a transparent ohmic contact 33 which extends across a larger portion of the top surface of the LED 20 to help spread current and thus increase brightness.

A preferred ohmic contact to the silicon carbide substrate comprises nickel, but can also comprise other appropriate metals or metal combinations such as nickel-vanadium.

The double heterostructure light emitting diode 20 illustrated in FIG. 1 will consistently produce an emission with a peak wavelength of about 430 nanometers (nm) and a bandwidth at half maximum of about 65 nm when a typical LED current (for example between 10 and 40 milliamps) is applied across the p-n junction that is formed by the aluminum gallium nitride layer 27 of the heterostructure and the gallium nitride active layer 26 of the heterostructure 24.

Figure 2:
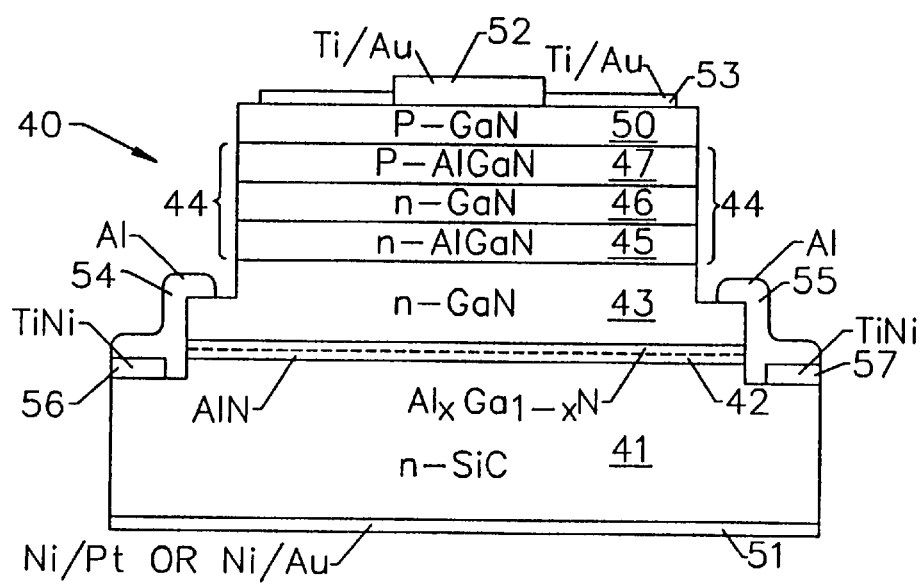
FIG. 2 is a cross-sectional view of a second embodiment of an LED according to the present invention.

FIG. 2 shows a slightly different embodiment of an LED 40 according to the present invention. In FIG. 2, the substrate is shown at 41, and the buffer layer is shown at 42, but which in this embodiment comprises an insulating buffer layer. As noted earlier herein, the buffer layer can comprise the structure disclosed in U.S. Pat. No. 5,393,993. Alternatively, the buffer layer 42 can comprise a graded layer of AlGaN that is substantially entirely aluminum nitride where it meets the substrate 41, and then is progressively graded with increasing amounts of gallium until it is substantially entirely gallium nitride at its upper surface where it meets the n-type layer of gallium nitride shown as 43 in FIG. 2 and as 23 in FIG. 1.

The double heterostructure is illustrated at 44 in FIG. 2 and in a preferred embodiment comprises the n-type aluminum gallium nitride layer 45 that otherwise corresponds to the layer 25 described with respect to FIG. 1, a compensated n-type gallium nitride active layer 46 which likewise corresponds to the gallium nitride active layer 26 described with respect to FIG. 1, and a p-type aluminum gallium nitride layer 47 which similarly corresponds to the layer 27 described with respect to FIG. 1. A p-type gallium nitride layer 50 corresponding to layer 30 in FIG. 1 is on the heterostructure, and the ohmic contacts 51 to the substrate and 52 and 53 to the top of the diode correspond to those described as 31, 32, and 33 in FIG. 1.

As FIG. 2 illustrates, however, because the buffer layer 42 in this embodiment is insulating rather than conductive, some other path for current flow must be provided between the ohmic contact 51 on the substrate and the ohmic contacts 52 and 53 on the top layer of the diode. This contact is made through shorting contacts 54 and 55 which are preferably formed on aluminum or titanium and aluminum and which provide an ohmic contact to the n-type gallium nitride layer 43. In the most preferred embodiments, these shorting contacts further include portions illustrated at 56 and 57 that are in immediate contact with the n-type silicon carbide substrate and which are formed of titanium and nickel to produce an appropriate ohmic contact with the silicon carbide.

In another aspect, the invention comprises a method of producing an active layer of compensated gallium nitride for a double heterostructure light emitting diode that emits in the blue portion of the visible spectrum. In this aspect, the invention comprises introducing vaporized sources of gallium, nitrogen, silicon and zinc into a chemical vapor deposition system that includes a semiconductor substrate compatible with the growth of gallium nitride thereon. The temperature is maintained high enough to promote the epitaxial growth of zinc and silicon compensated gallium nitride, but lower than the temperature at which the gallium nitride would decompose. As is well understood by those of ordinary skill in this art, the temperature must be high enough to provide the energy required to get atoms to move across the epitaxial growth surface, and in preferred embodiments of the present invention, this temperature is generally maintained between about 800° C. and 1050° C.

It will be further understood by those of ordinary skill in this art, that gas flow rates and specific temperatures are generally system-dependent, and thus specific temperatures and the like other than those recited herein will fall within the method aspects of the invention because they can be easily determined for particular chemical vapor deposition ("CVD") systems by those of ordinary skill in this art and without undue experimentation.

As another limiting factor, the temperature is preferably maintained lower than the temperature at which the surface morphology of the epitaxial layer would become unacceptable for further epitaxial growth thereon.

In preferred embodiments, the step of introducing the vaporized source of gallium comprises introducing trimethyl gallium, $(CH_3)_3Ga$; the step of introducing a vaporized source of nitrogen comprises introduces ammonia, $NH_3$; the step of introducing a vaporized source of zinc comprises introducing dimethyl zinc, $(C_2H_5)_2Zn$; and the step of introducing a vaporized source of silicon comprises introducing silane, $SiH_4$. The preferred aluminum source (for the AlGaN layers) is trimethyl aluminum, $(CH_3)_3Al$; and when magnesium is introduced, the preferred source is biscyclopentadienyl magnesium, $(C_5H_5)_2Mg$.

Figure 3:
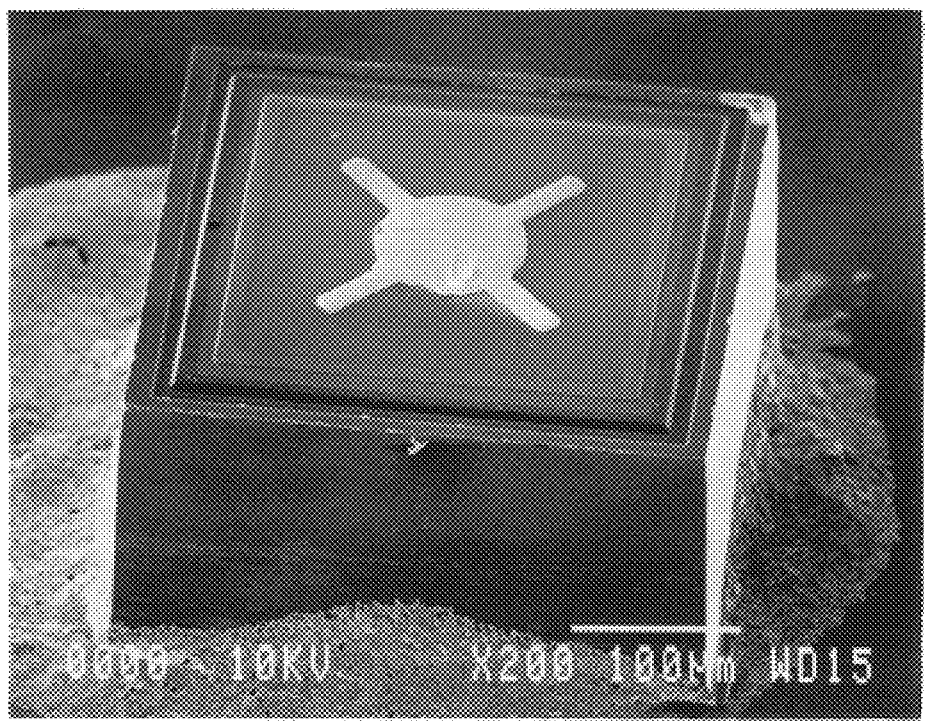
FIG. 3 is a scanning electron micrograph of an LED manufactured according to the present invention.

FIG. 3 is an SEM photograph of an LED according to the present invention. Such a device has a chip size of about 14 mil×14 mil, with a 10 mil×10 mil mesa portion. The substrate is about 7 or 8 mils thick, the n-GaN layer (e.g. 23 in FIG. 1 or 43 in FIG. 2) is about 3 microns thick and the layers in the heterostructure (n-AlGaN, GaN, and p-AlGaN are each about 1000 angstroms (Å) thick. The top GaN layer (e.g. 30 in FIG. 1 and 50 in FIG. 2) is about 4000 Å thick.

Figure 4:
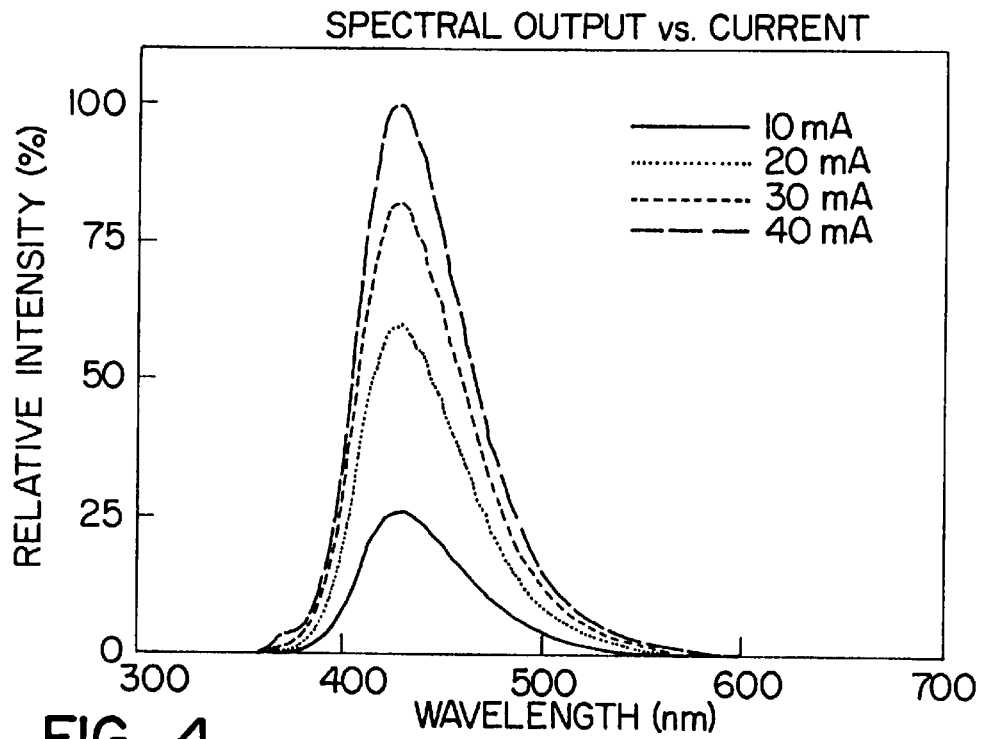
FIG. 4 is a plot of spectral output versus current for an LED according to the present invention.

FIGS. 4–14 illustrate various performance characteristics of the layers that make up the heterostructure and heterostructure diode according to the present invention. FIG. 4 illustrates the spectral response of a gallium nitride double heterojunction light emitting diode formed on a silicon carbide substrate according to the present invention as a function of operating current. FIG. 4 shows measurements made at four different currents between 10 and 40 milliamps (mA). The peak emission wavelength is 430 nanometers (nm) with a bandwidth at half maximum of about 60 nanometers which is characteristic of the silicon and zinc compensated gallium nitride active layer.

Figure 5:
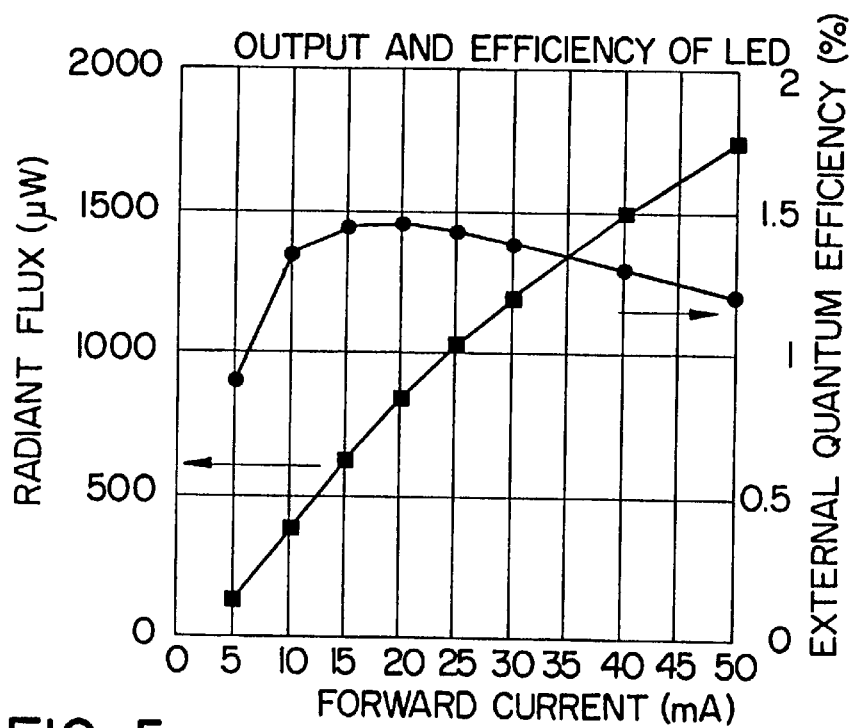
FIG. 5 is a plot of output and efficiency versus forward current for an LED according to the present invention.

FIG. 5 illustrates the power output and external quantum efficiency of a light emitting diode according to the present invention as a function of operating current. As a normal operating current for such an LED (i.e. approximately 20 milliamps), the output is approximately 850 microwatts which corresponds to an external quantum efficiency of about 1.5%.

Figure 6:
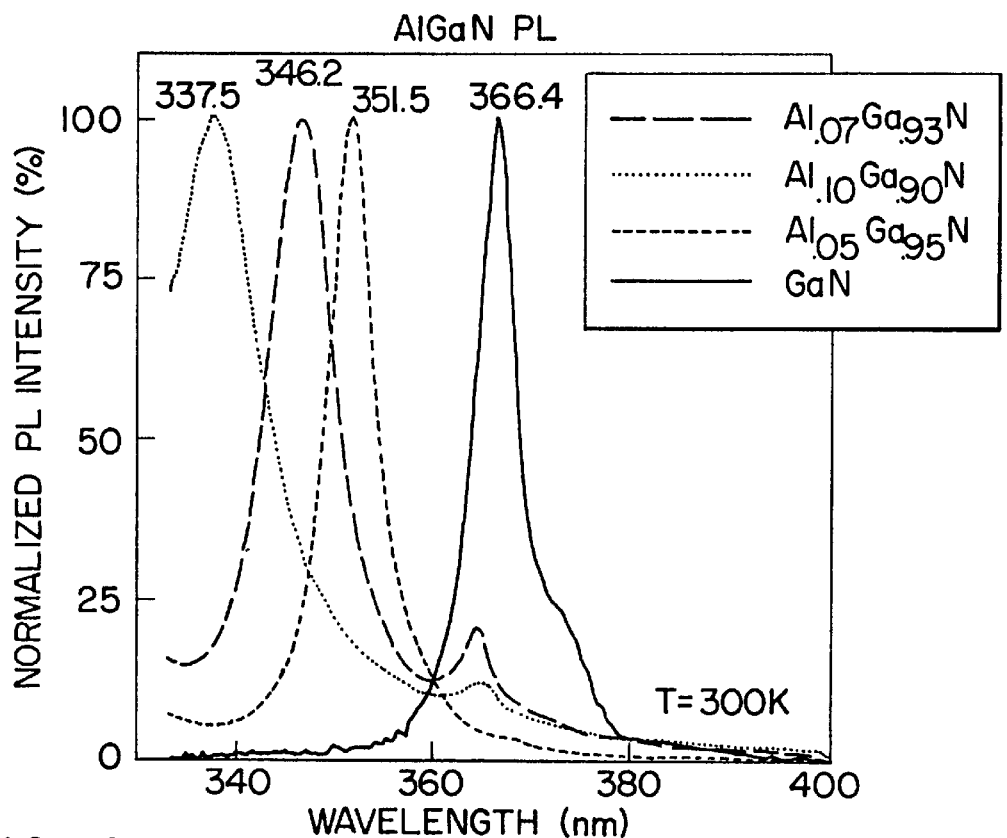
FIG. 6 is a plot of the normalized photoluminescence intensity versus wavelength for aluminum gallium nitride ($Al_xGa_{1-x}N$)

FIG. 6 illustrates the room temperature photoluminescence of various combinations of aluminum gallium nitride on silicon carbide substrates and also including a pure gallium nitride layer for comparative purposes. The clean, well defined peaks that are measured at room temperature demonstrate the high crystal quality of these layers. These photoluminescent measurements were made by exciting the layers with a 10 milliwatt helium/cadmium laser at 325 nanometers.

Figure 7:
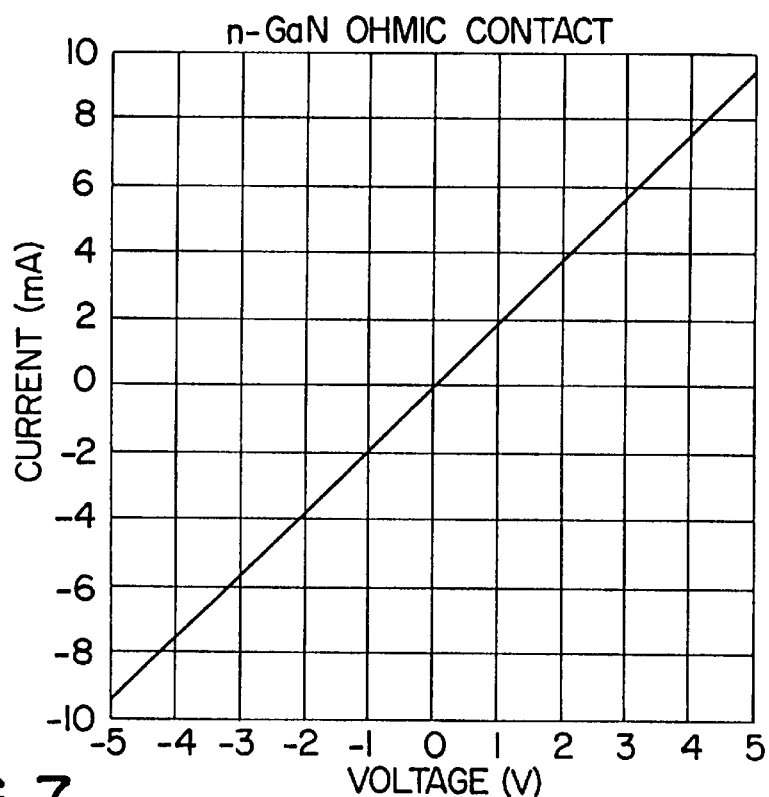
FIG. 7 is a plot of current versus voltage for ohmic contacts made to n-type gallium nitride on silicon carbide.

FIG. 7 demonstrates the current voltage characteristics of ohmic contacts made to n-type gallium nitride on silicon carbide substrates according to the present invention. The preferred ohmic contact metal is aluminum which yields a contact resistance of about $10^{-5}$ ohm-$cm^2$ for an n-type gallium nitride layer with a donor density of about $10^{18}$ $cm^{-3}$.

Figure 8:
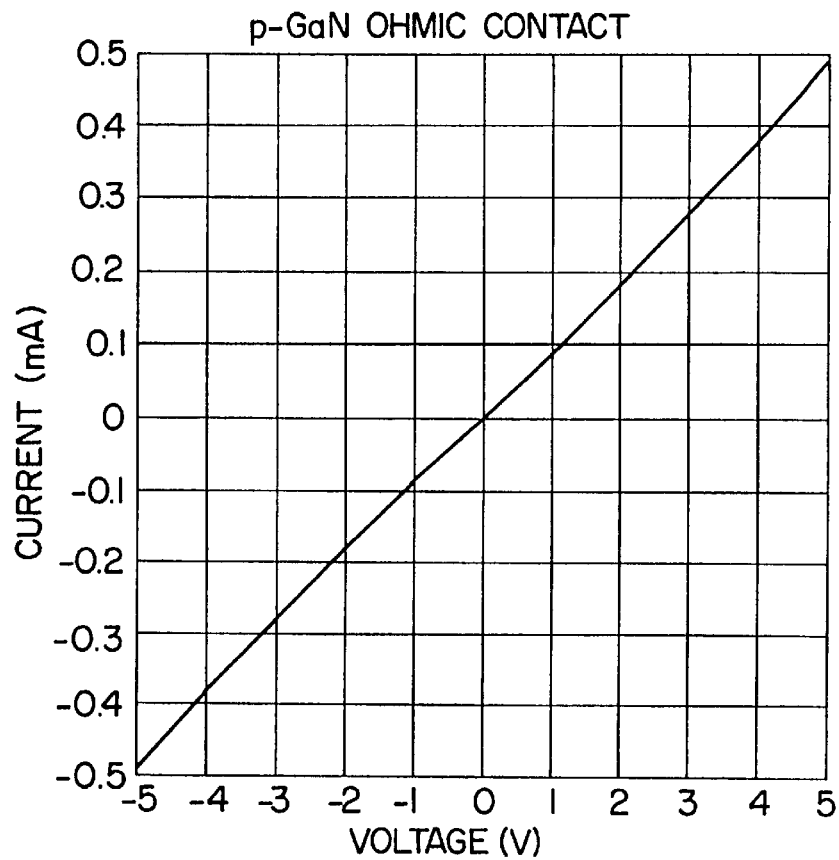
FIG. 8 is a plot similar to FIG. 7 except with the ohmic contact made to p-type gallium nitride.

FIG. 8 is a similar current voltage plot demonstrating the characteristics of ohmic contacts made to p-type gallium nitride on silicon carbide substrates according to the present invention. The preferred ohmic contact metal is an alloy of titanium and gold which yields a contact resistance of approximately $10^{-2}$ ohms-cm$^2$ for a p-type acceptor density of approximately 6E17 in the gallium nitride layer.

Figure 9:
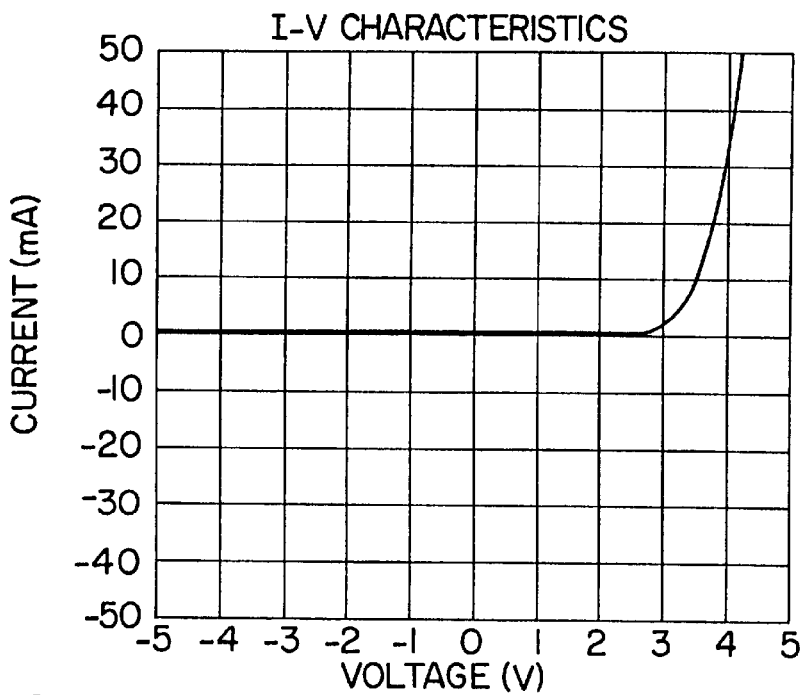
FIG. 9 is a plot of the current-voltage characteristics of an LED according to the present invention.

FIG. 9 is the current voltage (I-V) curve for a gallium nitride double heterojunction light emitting diode on silicon carbide according to the present invention. In reverse bias no leakage current is detected. Under forward bias the LED begins to turn on at about 2.7 volts and exhibits an operating voltage of about 3.7 volts at a typical current of 20 milliamps.

Figure 10:
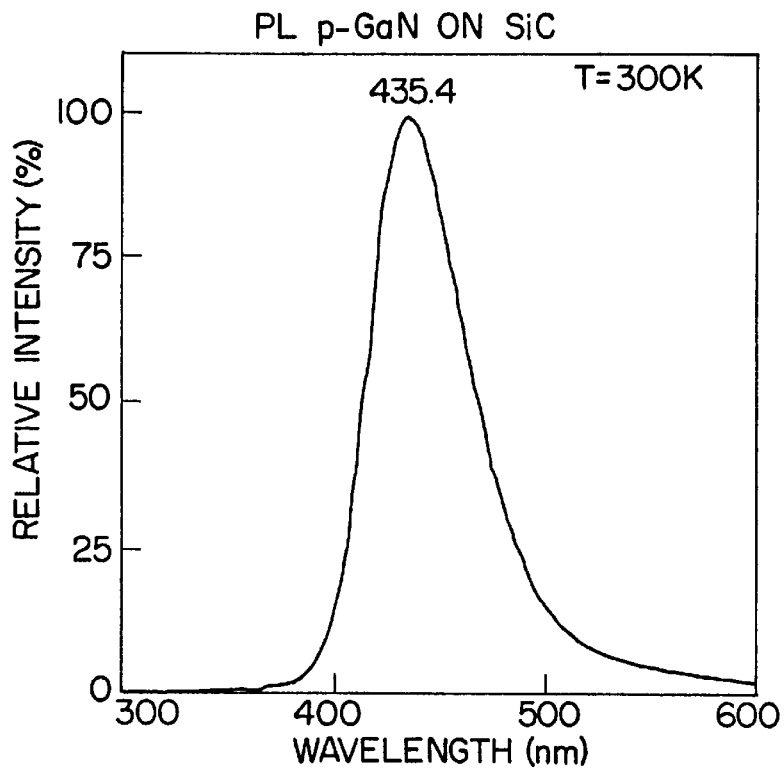
FIG. 10 is a plot of the room temperature photoluminescence of magnesium doped p-type gallium nitride on silicon carbide.

FIG. 10 illustrates the room temperature photoluminescence of magnesium doped p-type gallium nitride on silicon carbide. The peak occurs at about 435 nanometers for a layered doped to a net acceptor concentration of about 6E17.

Figure 11:
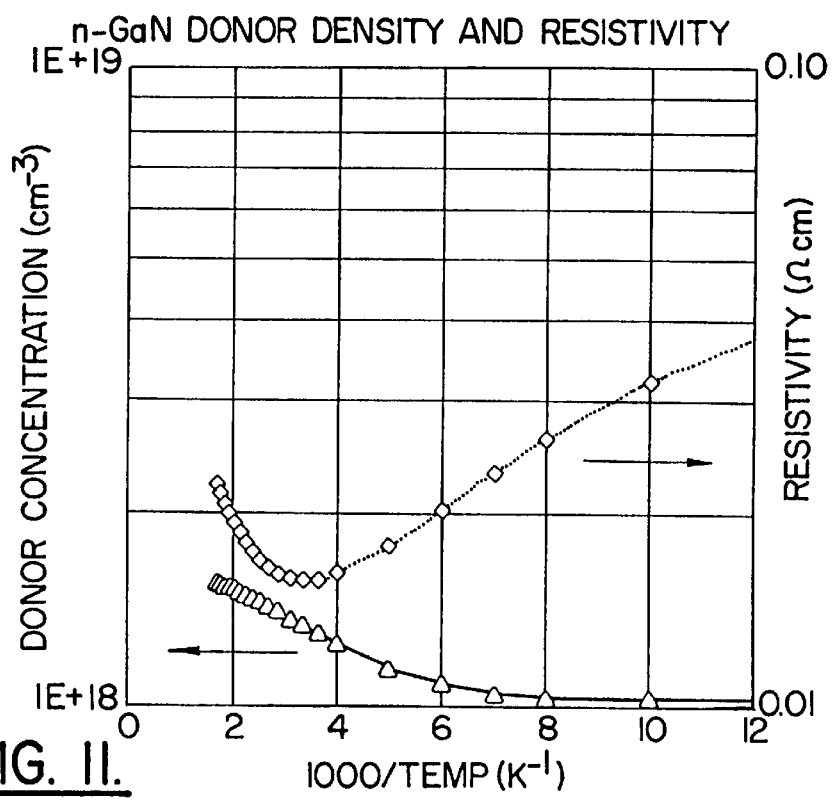
FIG. 11 is a Hall effect plot demonstrating the carrier concentration and resistivity of the n-type gallium nitride layer as a function of temperature.

FIG. 11 is a partial logarithmic plot of Hall effect data showing the carrier concentration and resistivity of an n-type gallium nitride as a function of temperature, plotted inversely to temperature. The layer from which the measurements for FIG. 11 were taken was doped with silicon to a net donor concentration of about 1.4E18 and had a resistivity of 0.016 ohm-centimeter at room temperature.

Figure 12:
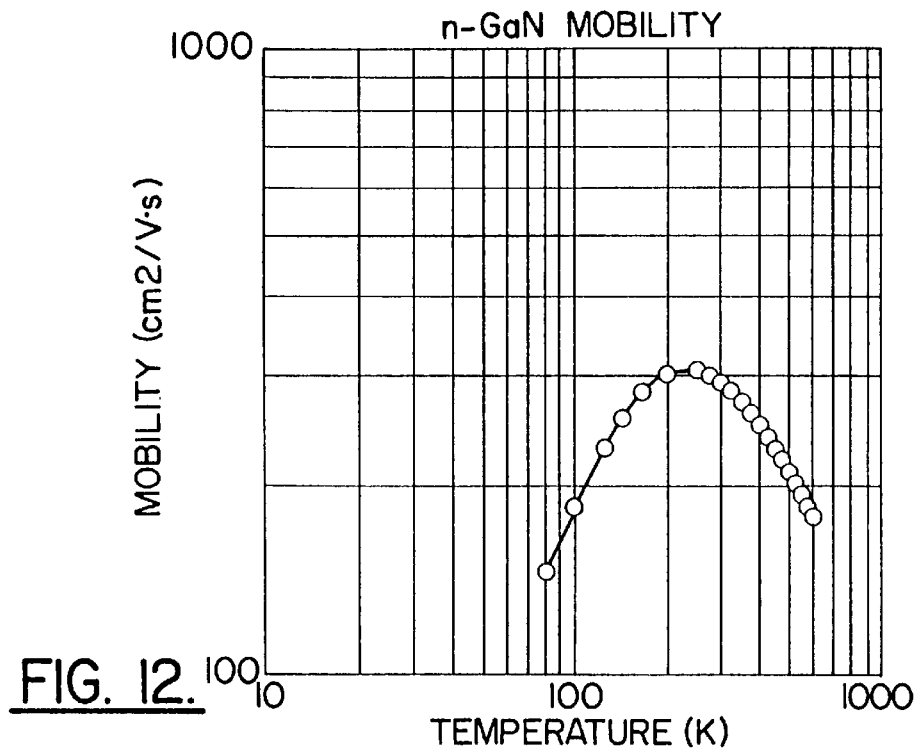
FIG. 12 illustrates the mobility data for a silicon doped n-type gallium nitride layer on silicon carbides.

FIG. 12 is corresponding data for the same layer as illustrated by FIG. 11, but demonstrating mobility for the layer. The mobility of the layer is approximately 300 cm$^2$/V•s at room temperature, a high value for this doping level indicating the high quality nature of the layer.

Figure 13:
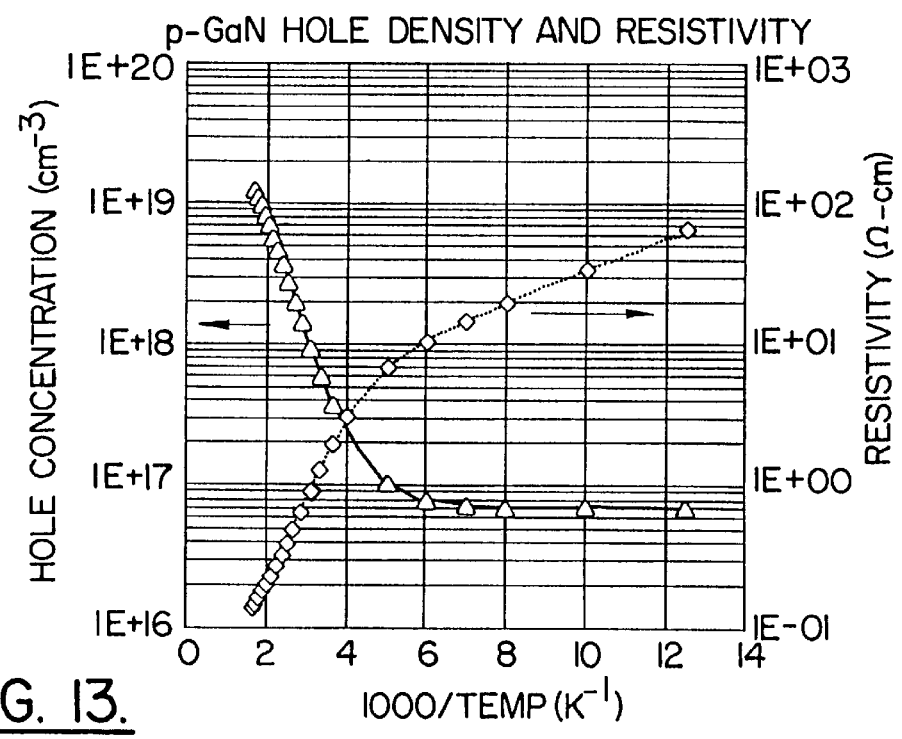
FIG. 13 is another Hall effect plot showing the hole concentration and resistivity of magnesium doped gallium nitride as a function of temperature.

FIG. 13 is a plot of Hall effect data showing the acceptor concentration and resistivity of magnesium doped gallium nitride as a function of temperature (plotted inversely). The net acceptor concentration for this layer was about 6E17 and showed a resistivity of about 1.3 ohms-centimeter at room temperature.

Figure 14:
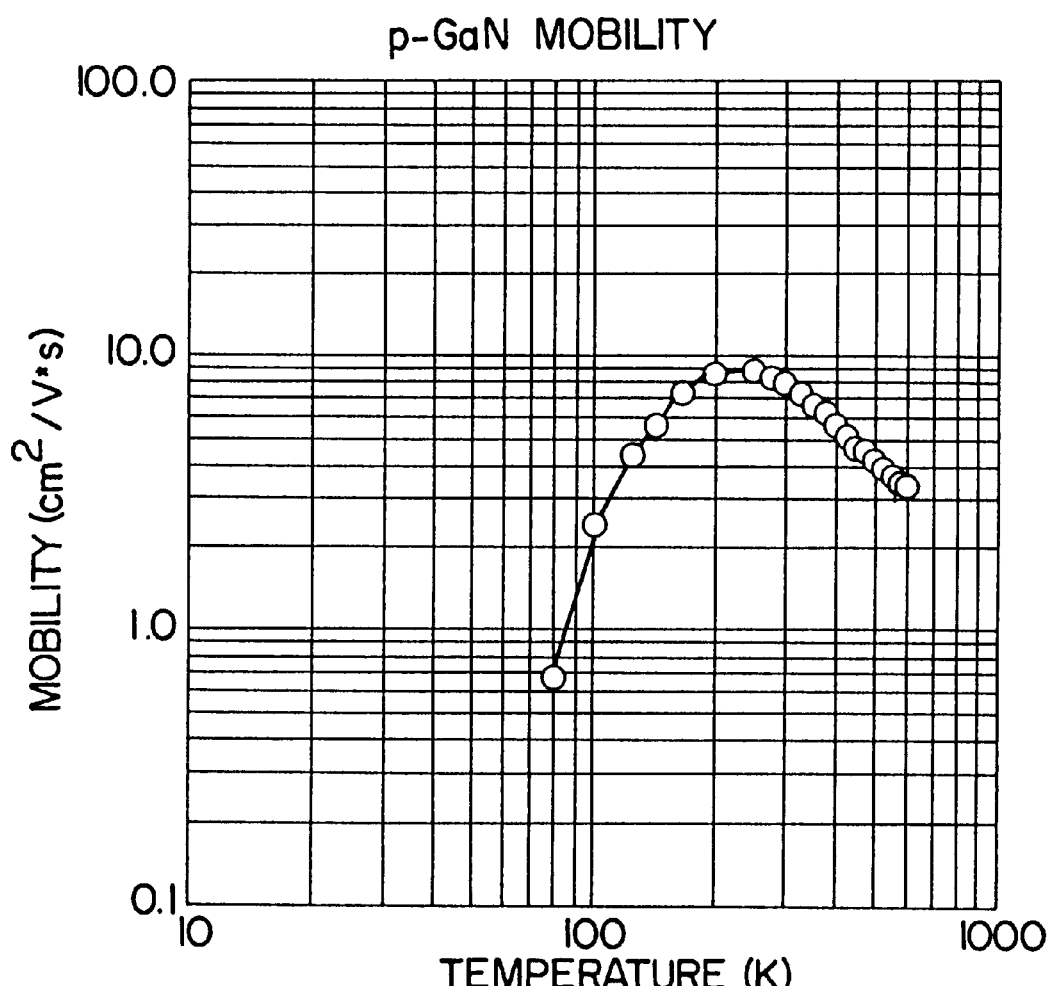
FIG. 14 is a plot of the mobility data for a magnesium doped p-type gallium nitride layer on silicon carbide.

FIG. 14 illustrates the corresponding mobility data for the same layer as FIG. 13 and illustrates that the mobility of the layer is approximately 8 cm$^2$/V•s at room temperature which is typical of the mobility of p-type gallium nitride.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed:

1. A method of producing an active layer of zinc and silicon compensated n-type gallium nitride for a double heterostructure light emitting diode that emits in the blue portion of the visible spectrum, the method comprising:

introducing vaporized sources of gallium, nitrogen, silicon and zinc into a chemical vapor deposition system that includes a semiconductor substrate compatible with the growth of gallium nitride thereon; and while maintaining the temperature high enough to promote the epitaxial growth of zinc and silicon compensated gallium nitride, but lower than the temperature at which the gallium nitride would decompose.

2. A method according to claim 1 wherein the temperature is maintained lower than the temperature at which the surface morphology of the epitaxial layer would become unacceptable for further epitaxial growth thereon.

3. A method according to claim 1 wherein the temperature is maintained between about 800° C. and 1050° C.

4. A method according to claim 1 wherein the step of introducing a vaporized source of gallium comprises introducing trimethyl gallium.

5. A method according to claim 1 wherein the step of introducing a vaporized source of nitrogen comprises introducing ammonia.

6. A method according to claim 1 wherein the step of introducing a vaporized source of zinc comprises introducing diethyl zinc.

7. A method according to claim 1 wherein the step of introducing a vaporized source of silicon comprises introducing silane.

* * * * *